United States Patent [19]

Hsu et al.

[11] Patent Number: 5,338,701
[45] Date of Patent: Aug. 16, 1994

[54] METHOD FOR FABRICATION OF W-POLYCIDE-TO-POLY CAPACITORS WITH HIGH LINEARITY

[75] Inventors: Shun-Liang Hsu; Chun-Yi Shi, both of Hsin-Chu; Mou-Shiung Lin, Hsinchu, all of Taiwan

[73] Assignee: Taiwan Semiconductor Manufacturing Company, Hsinchu, Taiwan

[21] Appl. No.: 145,154

[22] Filed: Nov. 3, 1993

[51] Int. Cl.$^5$ .................. H01L 21/334; H01L 21/283
[52] U.S. Cl. ...................................... 437/60; 437/47; 437/56; 437/193; 437/200; 437/919
[58] Field of Search .............. 437/60, 193, 200, 919, 437/47, 52, 56, 57, 238; 257/296, 300

[56] References Cited

U.S. PATENT DOCUMENTS

| | | | |
|---|---|---|---|
| 5,037,772 | 8/1991 | McDonald | 437/52 |
| 5,045,966 | 9/1991 | Alter | 361/313 |
| 5,057,447 | 10/1991 | Paterson | 437/43 |
| 5,086,370 | 2/1992 | Yasaitis | 361/313 |
| 5,173,437 | 12/1992 | Chi | 437/60 |
| 5,232,874 | 8/1993 | Rhodes et al. | 437/195 |
| 5,286,991 | 2/1994 | Hui et al. | 257/306 |

FOREIGN PATENT DOCUMENTS 0183623 11/1985 European Pat. Off. .

Primary Examiner—T. N. Quach
Attorney, Agent, or Firm—George O. Saile; Stephen B. Ackerman

[57] ABSTRACT

A method of forming a polycide-to-polysilicon capacitor simultaneously with a CMOS device with polycide gate is described. Field oxide regions, n-well and p-well regions, and gate oxide regions are formed in and on a silicon substrate. A first layer of polysilicon, having a suitable doping concentration, is formed on the surface of the substrate and the field oxide regions. A layer of silicide is formed over the layer of polysilicon. The layer of silicide is ion implanted in a vertical direction to produce the low voltage coefficient and high linearity. A layer of interpoly oxide is formed over the layer of silicide. The layer of interpoly oxide is densified. A second layer of polysilicon is formed on the surface of the interpoly oxide. The second layer of polysilicon is doped, and then patterned to form the top plate of the capacitor. The layer of interpoly oxide is removed, except in the area under the top plate of the capacitor, where it acts as a capacitor dielectric. The layer of silicide and the layer of polysilicon are patterned to form a polycide bottom plate of the capacitor and to form the polycide gate. The layer of silicide is annealed. The source and drain regions of the CMOS device are formed in the substrate in the regions between the polycide gate and the field oxide regions; and the remaining layers are formed to complete the integrated circuit.

20 Claims, 7 Drawing Sheets

METHOD FOR FABRICATION OF W-POLYCIDE-TO-POLY CAPACITORS WITH HIGH LINEARITY

RELATED PATENT APPLICATIONS

1) "Fabrication of W-Polycide-to-Poly Capacitors with High Linearity", inventors S. L. Hsu, M. S. Lin, M. D. Lei, Ser. No. 08/102,977, filing date Jul. 28, 1993.

BACKGROUND OF THE INVENTION (1) Field of the Invention

The invention relates to the manufacture of highly dense integrated circuits and more particularly to the formation of polycide-to-polycrystalline silicon capacitors and field effect transistor (FET) devices within the integrated circuit.

(2) Description of the Related Art

In recent years there continues to be dramatic density increases in the integrated circuit technology. The minimum feature size of lithography has been reduced to one micrometer and below. In the fabrication of precision capacitors in conjunction with FET devices on the same chip at these reduced dimensions, it is increasingly difficult to maintain such parameters as low voltage and temperature coefficients and low leakage current.

Workers in the field have described the formation of capacitors using two layers of polysilicon. McDonald in U.S. Pat. No. 5,037,772 describes a method for fabricating a polysilicon-to-polysilicon capacitor on the same chip as CMOS and BiCMOS devices. A first polysilicon layer is deposited and ion-implanted with arsenic. A silicon oxide/silicon nitride dielectric layer is then formed and patterned to the capacitor dimensions. A second polysilicon layer is deposited. An anisotropic etch is then performed, with the dielectric layer acting as a mask to protect the first polysilicon layer.

In European Patent Application 0 183 623, Krishner also describes a process for producing a precision polysilicon-to-polysilicon capacitor in conjunction with MOS devices on the same chip. However, it is noted that the deposition of silicon nitride as part of the dielectric layer causes uniformity problems, due to the difficulty of depositing a uniformly thick layer of the silicon nitride. Thus in this invention a single layer of thermally grown silicon dioxide is used as the capacitor dielectric. The oxidation process includes an annealing step. The dielectric layer is grown from a first polysilicon layer that has been ion-implanted with phosphorus or arsenic. A low energy implant is described which allows for precise control of the subsequent dielectric thickness. However, neither this approach nor that in U.S. Pat. No. 5,037,772 directly addresses the problems of non-linearity and instability of the capacitor voltage coefficient, high voltage and temperature coefficients, high leakage current, and unstable oxide capacitance, as feature sizes are reduced to one micrometer and less.

In addition, the use of polycide gates and capacitors, polycide being a combination of layers of polysilicon and a refractory metal silicide, is becoming very important as the industry moves to smaller device geometries. As these geometries become smaller, polysilicon becomes less satisfactory due to its high resistivity and the subsequent affect on RC time delays and IR voltage drops. The use of a combination of a top-layer refractory metal silicides with polysilicon, to form a polycide, has proven suitable because of its lower resistivity.

Polycide has typically been used in the prior art in precision capacitors in the formation of the bottom capacitor plate. The rest of the capacitor is formed by adding a dielectric and a polysilicon top plate. However, as feature sizes are reduced to one micrometer or less, this structure has the problems of non-linearity and instability of the capacitor voltage coefficient, high voltage and temperature coefficients, and unstable oxide capacitance.

A method of forming a polycide-to-polysilicon capacitor and CMOS integrated circuit to overcome these problems is described in the Related Patent Application, Ser. No. 08/102,977. A heavy ion-implant of the polycide bottom plate of the capacitor improves many of the capacitor characteristics noted above. However, the source/drain regions of the transistor are formed prior to doping of the polysilicon top plate of the capacitor. This can lead to a short-channel effect in the P-channel of the CMOS device, due to the high temperature drive-in during the polysilicon top-plate doping.

SUMMARY OF THE INVENTION

It is therefore a principal object of the invention to provide a method for making a polycide-to-polysilicon capacitor and CMOS integrated circuit which by the nature of the method will provide for an improved CMOS P-channel device, highly linear voltage coefficient of the capacitor, low voltage and temperature coefficients, low leakage current in the interpoly oxide, improved voltage coefficient stability, and stable oxide capacitance.

These objects are achieved by fabricating an integrated circuit which includes a polycide-to-polysilicon capacitor and a CMOS device with polycide gate. Field oxide regions, n-well and p-well regions, and gate oxide regions are formed in and on a silicon substrate. A first layer of polysilicon, having a suitable doping concentration, is formed on the surface of the substrate and the field oxide regions. A layer of silicide is formed over the layer of polysilicon. The layer of silicide is ion implanted in a vertical direction to produce the low voltage coefficient and high linearity. A layer of interpoly oxide is formed over the layer of silicide. The layer of interpoly oxide is densified. A second layer of polysilicon is formed on the surface of the interpoly oxide. The second layer of polysilicon is doped, and then patterned to form the top plate of the capacitor. The layer of interpoly oxide is removed, except in the area under the top plate of the capacitor, where it acts as a capacitor dielectric. The layer of silicide and the layer of polysilicon are patterned to form a polycide bottom plate of the capacitor and to form the polycide gate. The layer of silicide is annealed. The source and drain regions of the CMOS device are formed in the substrate in the regions between the polycide gate and the field oxide regions; and the remaining layers are formed to complete the integrated circuit.

These objects are also achieved in a different manner in fabricating an integrated circuit which includes a polycide-to-polysilicon capacitor and a CMOS device with polycide gate. Field oxide regions, n-well and p-well regions, and gate oxide regions are formed in and on a silicon substrate. A first layer of polysilicon, having a suitable doping concentration, is formed on the surface of the substrate and the field oxide regions. A layer of silicide is formed over the layer of polysilicon. The layer of silicide is ion implanted in a vertical direction to produce the low voltage coefficient and high linearity.

The layer of silicide and the layer of polysilicon are patterned to form a polycide bottom plate of the capacitor and to form the polycide gate. A layer of interpoly oxide is formed over polycide bottom plate, polycide gate, and exposed regions of the substrate. The layer of interpoly oxide is densified. A second layer of polysilicon is formed on the surface of the layer of interpoly oxide. The second layer of polysilicon is doped, and then patterned to form the top plate of the capacitor. The layer of interpoly oxide is removed, except in the area under the top plate of the capacitor, where it acts as a capacitor dielectric. The layer of silicide is annealed. The source and drain regions of the CMOS device are formed in the substrate in the regions between the polycide gate and the field oxide regions, and the remaining layers are formed to complete the integrated circuit.

DESCRIPTION OF THE PREFERRED EMBODIMENTS

Figure 1:
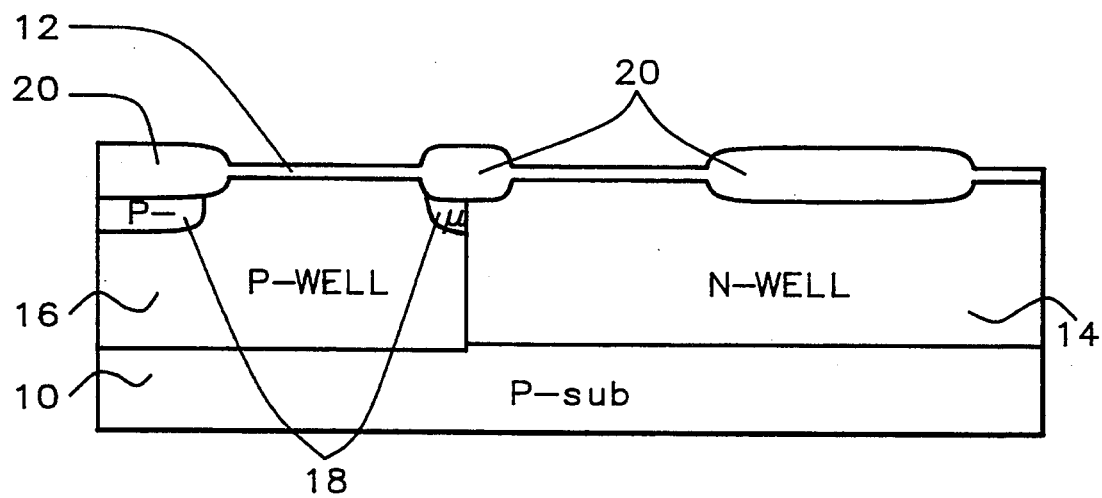
FIGS. 1 to 9 are a schematic cross-sectional representation of a new method for fabricating a polycide-to-polysilicon capacitor in conjunction with a CMOS device, which has an improved P-channel transistor, highly linear voltage coefficient of the capacitor, low voltage and temperature coefficients, lower leakage current in the interpoly oxide, improved voltage coefficient stability, and stable oxide capacitance.

Referring now to FIG. 1, there is shown a partially completed structure, formed by means well known in the art, for building an integrated circuit with CMOS devices and capacitors, using a twin-tub process. A more complete description of a twin-tub process can be found in *VLSI Technology*, 2nd edition, S. M. Sze, pp. 485–486, McGraw-Hill Book Company, Singapore, 1988. A lightly doped p-type substrate 10 is shown, preferably composed of silicon having a (100) crystallographic orientation. The surface of the silicon substrate 10 is thermally oxidized to form a pad oxide 12 to a thickness of between about 200 and 400 Angstroms. An N-well region 14 is formed by ion implantation of phosphorus, with the P-well region masked by a layer of silicon nitride ($Si_3N_4$). A well oxide (not shown) is then grown selectively over the N-well region, and a P-well region 16 is formed by ion implantation with boron. The N-well and P-well regions are driven in at a temperature of between about 1050° and 1200° C. A channel stop field implant 18 is formed by an ion implant of boron in the P-well region 16. The surface of the silicon substrate 10 is then thermally oxidized at selected locations, after being masked using conventional lithography and etching. The oxidation is performed at a temperature of between about 950° and 1000° C., and forms field oxide regions 20 having a thickness of between about 5000 and 7500 Angstroms. The field oxide regions are used to isolate semiconductor regions from other such regions, and to isolate the capacitor from the semiconductor regions.

Figure 2:
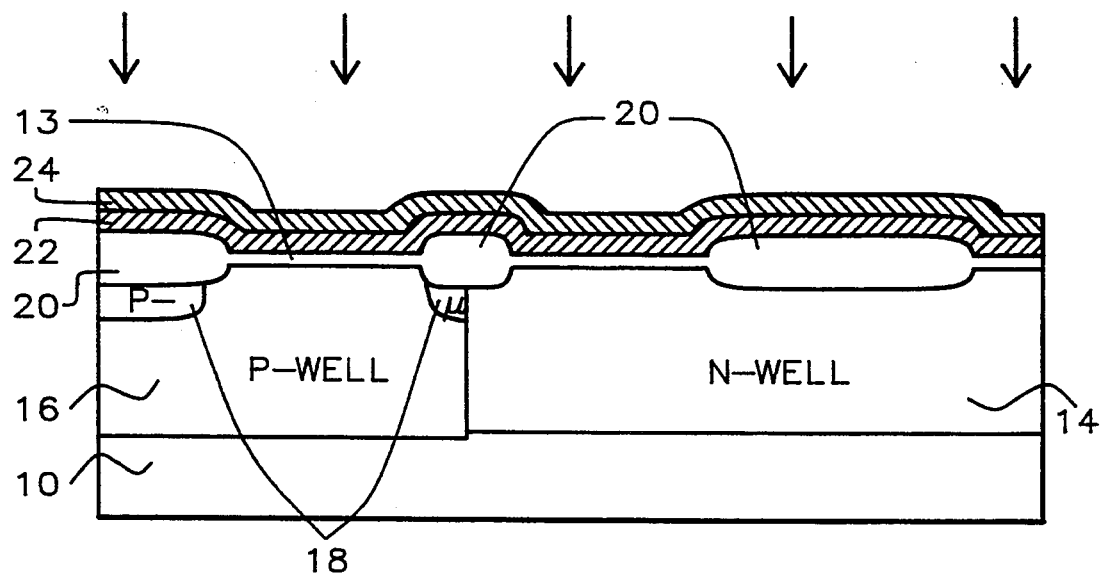

Referring now to FIG. 2, pad oxide 12 has been removed and gate oxide 13 thermally grown to a thickness of between about 100 and 200 Angstroms. First polysilicon layer 22 is blanket deposited over gate oxide 13 and field oxide regions 20, by LPCVD (Low Pressure Chemical Vapor Deposition) method. The preferred thickness of the polysilicon layer 22 is between about 1500 and 2000 Angstroms. The polysilicon layer 22 is doped by diffusion with phosphorus using phosphorus oxychloride ($POCl_3$) as a source at a temperature of between about 800° and 920° C. Tungsten silicide ($WSi_x$) layer 24 is blanket deposited over polysilicon layer 22 by LPCVD method, by reacting tungsten fluoride ($WF_6$) with silane ($SiH_4$). The preferred thickness of this layer is between about 1500 and 2000 Angstroms.

The amorphous refractory metal silicide layer has a chemical formulation of $WSi_x$, where x is between 2.6 and 2.8. An x value above this range would result in an undesirably high resistivity for the silicide film. An x value below this range increases the stress of the $WSi_x$ film and leads to adhesion problems between the silicide and polysilicon.

A critical ion implantation step is now performed. An N+ ion implantation is performed on silicide layer 24. The implantation is with Arsenic, As75 with a dose of between about 1 E 14 and 1 E 16 atoms/$cm.^2$, and an energy of between about 60 and 120 KeV. A lower dosage implant than that used for the CMOS active regions is preferred, to prevent adhesion problems at the interface between the silicide and the oxide layer formed on top of the silicide in a subsequent processing step. Alternately, the ion implantation could be performed with phosphorus, P31 at a dose of between about 1 E 14 and 5 E 15 atoms/$cm.^2$, and an energy of between about 60 and 90 KeV. The silicide could also be implanted with a P+ implantation using boron fluoride $BF_2$ at a dose of between about 1 E 15 and 5 E 15 atoms/$cm.^2$, and an energy of between about 50 and 80 KeV.

Figure 3:
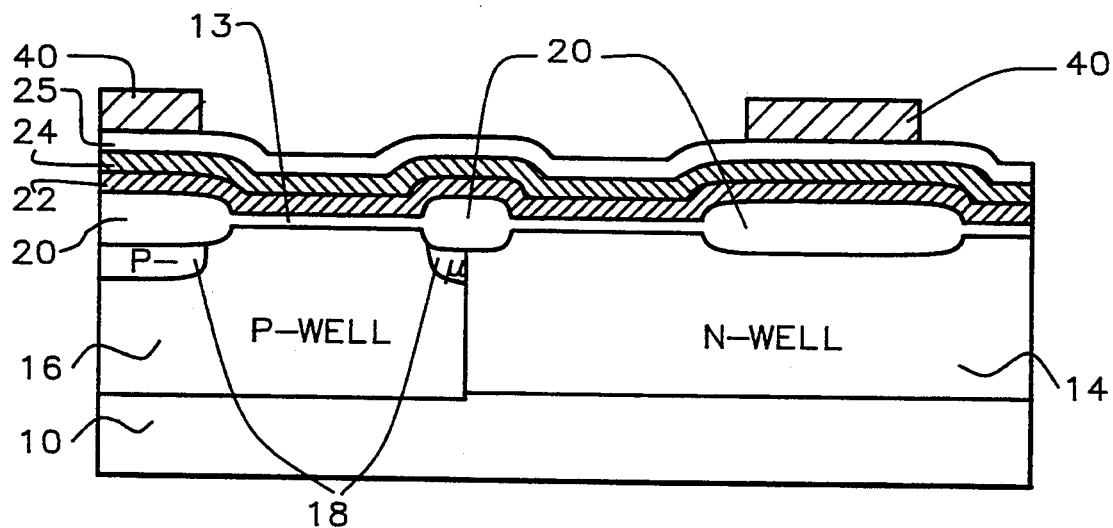

Referring now to FIG. 3, oxide layer 25 is formed by chemical vapor deposition (CVD) of tetraethoxysilane (TEOS) at a temperature of between about 700° and 800° C. and to a thickness of the between about 600 and 1400 Angstroms. This layer is then densified at a temperature of between about 800° and 900° C. for between about 30 and 60 minutes. The thickness of this oxide layer is dependent on the feature size of the integrated circuits being processed. For one-micron processing, the oxide layer thickness formed is between about 1000 and 1400 Angstroms. For 0.6-to-0.8 micron processing, the oxide layer thickness is between about 600 and 800 Angstroms.

A second polysilicon layer 40 is deposited by LPCVD, to a thickness of between about 2500 and 3500 Angstroms. The polysilicon layer is doped by diffusion with phosphorus using phosphorus oxychloride ($POCl_3$) as a source at a temperature of between about 850° and 920° C. Since the source/drain regions of the CMOS device have not yet been formed, this diffusion step does not effect the P-channel as in the prior art. Polysilicon layer 40 is then patterned by conventional lithography and etching to form the capacitor top plate, as shown in FIG. 3.

Figure 4:
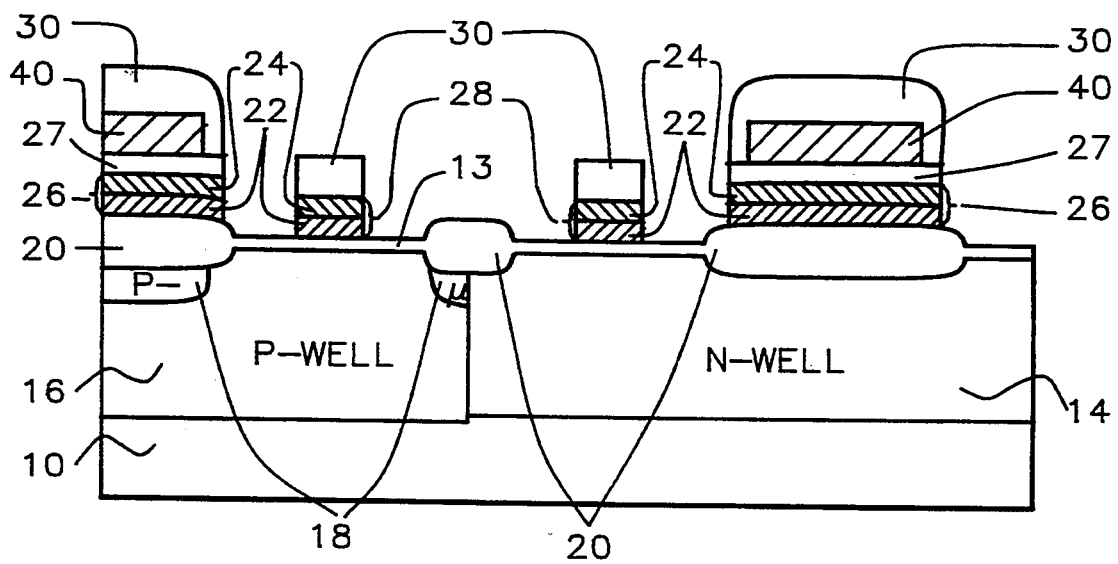

Referring now to FIG. 4, oxide layer 25 is removed by an etch of buffered hydrofluoric acid at a ratio of 50:1 for 3 minutes, in all but the area under the top capacitor plate, where it acts as dielectric 27 for the polycide-to-polysilicon capacitor. Photoresist 30 is formed by conventional lithography and etching techniques, to mask those regions of polysilicon layer 22 and silicide layer 24 which will remain to form the polycide capacitor bottom plate 26 and polycide gate 28. The polycide bottom capacitor plate 26 and polycide gate electrodes 28 are formed by anisotropic reactive ion etching. Photoresist 30 is removed and the silicide layer annealed at a temperature of between about 850° and 1000° C. for between about 30 and 60 minutes, to cause the amorphous refractory metal silicide to change into its crystalline phase.

The structure of the CMOS FET is now to be formed by the following steps. However, it is well understood by those skilled in the art that a P channel FET or N channel FET integrated circuit device could also be formed simply by using dopants of a single conductivity, and a substrate of a single opposite conductivity.

Figure 5:
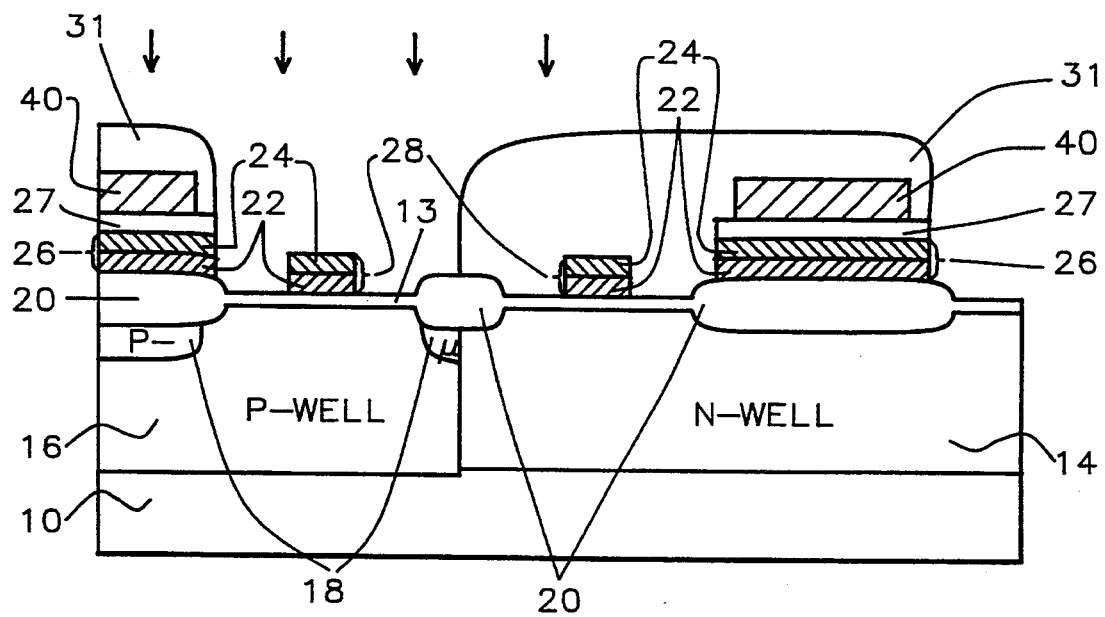

Referring now to FIG. 5, all regions of the structure except the active device region of the p-well are masked with a photoresist 31 by suitable lithography and etching, for N-ion implantation. Phosphorus ($P_{31}$) is ion implanted, as the first of two implants to form lightly doped drain regions, at an energy of between about 60 and 80 KeV, and at a dose of between about $1 \times 10^{13}$ and $3 \times 10^{13}$ atoms/cm.$^2$.

Figure 6:
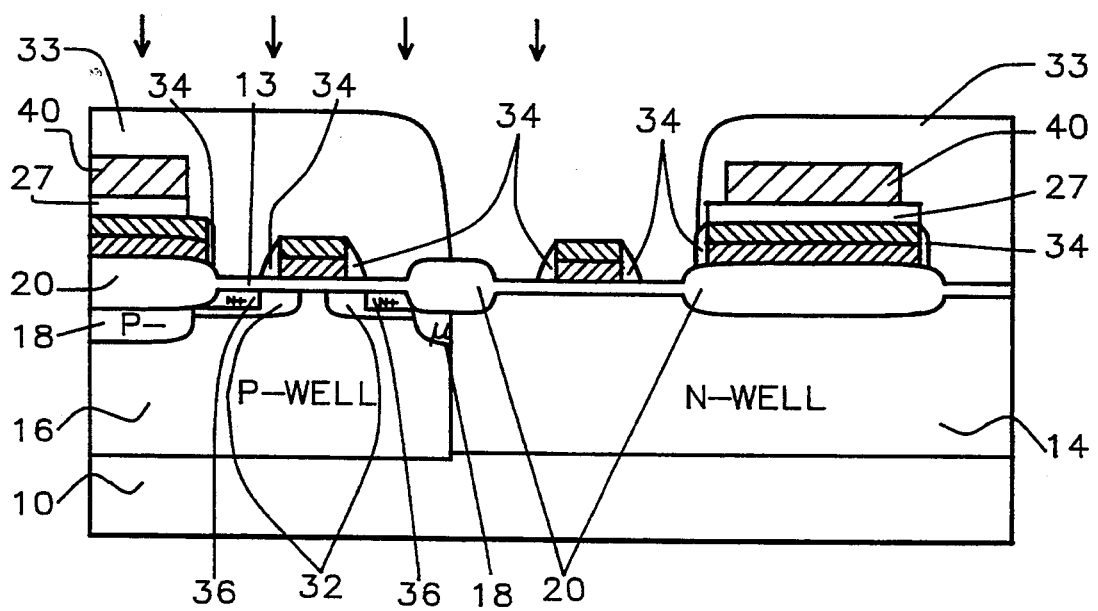

The resulting N− regions 32 are shown in FIG. 6. The dielectric spacers 34 are now to be formed followed by the completion of the lightly doped drain source/drain structures. A low temperature silicon oxide deposition is preferred such as through the chemical vapor deposition of tetraethoxysilane (TEOS) at a temperature in the range of between about 650° and 750° C. wherein the low temperature range process uses plasma enhanced CVD. Other silicon oxide deposition methods include silane based LPCVD. The thickness of the dielectric silicon oxide layer (not shown) is between about 2000 and 3000 Angstroms. An anisotropic etch of this layer produces the dielectric spacers 34 on the sidewalls of the gate electrodes 28 and capacitor bottom plate 26. The preferred anisotropic etching uses a conventional reactive ion etching ambient.

An N+ ion implantation is performed to complete the source/drain regions of the N-channel device. Photoresist 31 is re-formed using standard lithographic techniques and suitable etching to expose N+ regions 36, which are formed using an implant of arsenic AS75 (not shown) at a dose of between about 3 E 15 and 5 E 15 atoms/cm.$^2$, and an energy of between about 60 and 120 KeV.

Referring now to FIG. 6., the P-channel portion of the CMOS structure is now formed. The N-well region of the substrate is exposed by conventional lithography and etching, and an implant of boron fluoride $BF_2$ is performed, at a dose of between about 1 E 15 and 5 E 15 atoms/cm.$^2$, and an energy of between about 50 and 80 KeV. This results in P+ regions 38 as shown in FIG. 7, and completes formation of the CMOS device.

Figure 7:
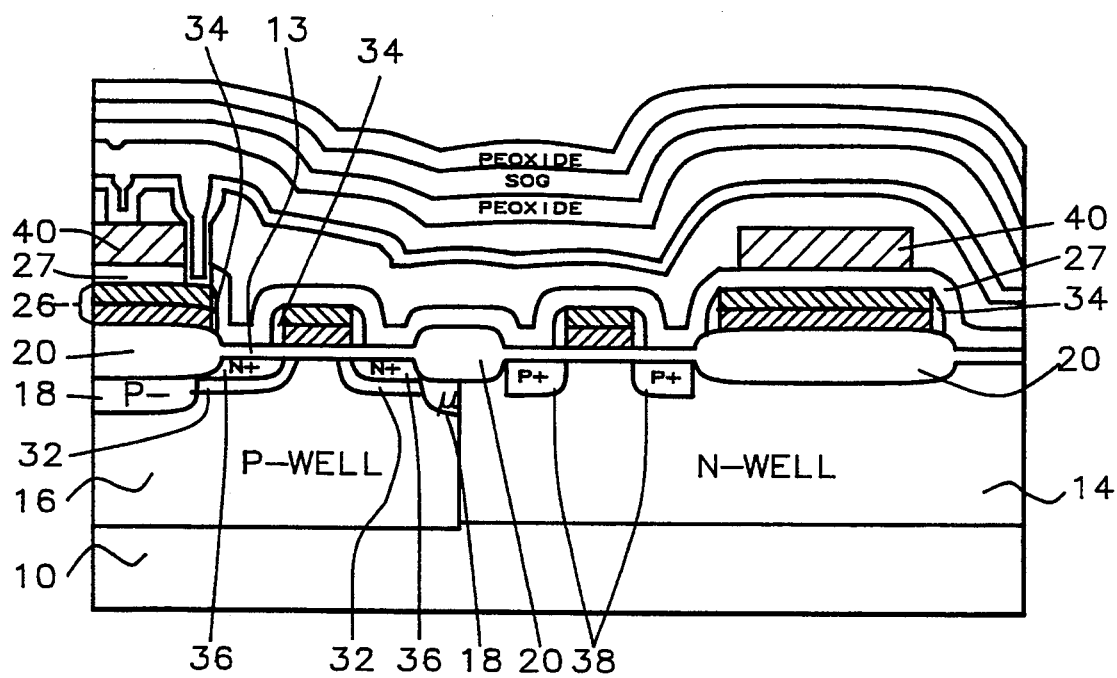

Referring now to FIG. 7, the integrated circuit is completed by forming a passivation layer over the structures described and appropriate electrical connecting structures thereover to electrically connect the gate electrode structures, capacitor and source/drain elements. FIG. 7 shows some of these layers and structures. These steps are not described in detail as they are conventional and not significant to the invention.

Figure 8:
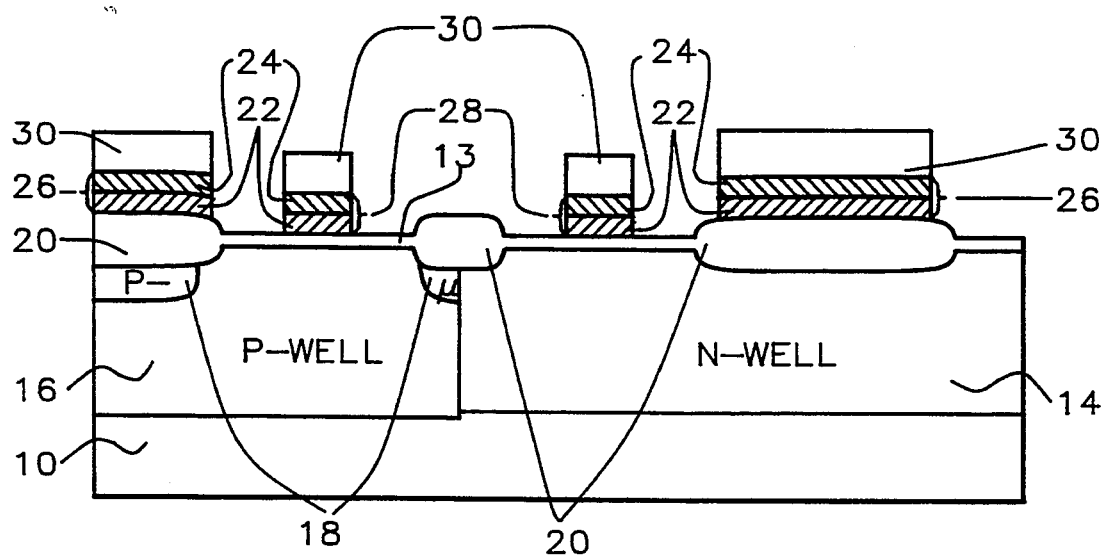

In a second embodiment of the invention, processing is the same as in the first embodiment up to the point of formation of the structure shown in FIG. 2, including the ion implant of silicide layer 24. Referring now to FIG. 8, a photoresist mask 30 is formed by conventional lithography and etching techniques on tungsten silicide layer 24. The polycide bottom capacitor plate 26 and polycide gate electrodes 28 are formed by anisotropic reactive ion etching, and photoresist 30 is removed.

Figure 9:
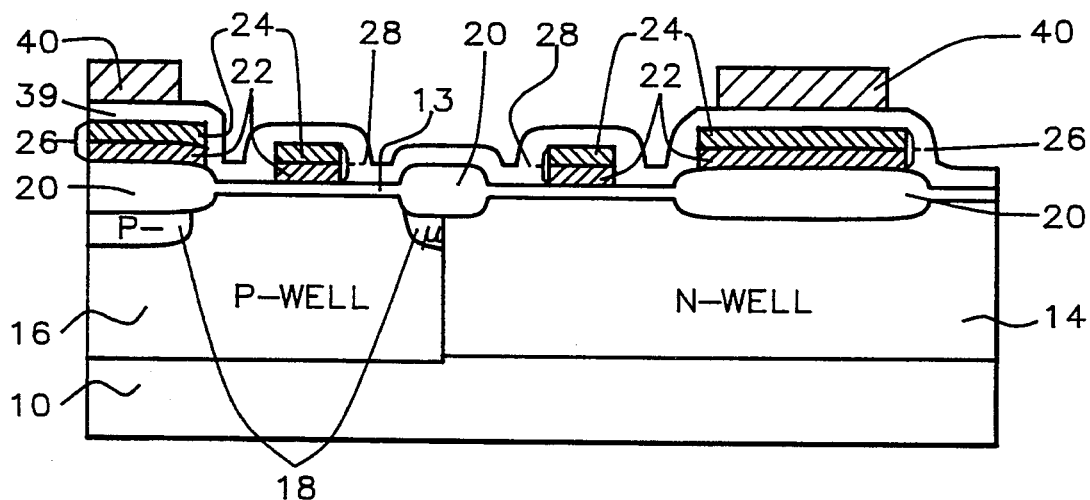

With reference to FIG. 9, a thin silicon oxide layer 39 is formed upon the capacitor bottom plate and the CMOS. device and the rest of the existing structure. This serves as the dielectric for the capacitor, and a surface damage masking layer for the rest of the integrated circuit. The method for forming this layer 39, and the resultant thickness, are the same as in the first embodiment for layer 25.

A second polysilicon layer is now blanket deposited over silicon oxide layer 39 by LPCVD method. The preferred thickness of the polysilicon layer is between about 2000 and 3500 Angstroms. The polysilicon layer is doped by diffusion with phosphorus using phosphorus oxychloride ($POCl_3$) as a source at a temperature of between about 850° and 920° C. As shown in FIG. 9, the capacitor top plate 40 is formed by conventional lithography and etching of the second polysilicon layer. This completes formation of the polycide-to-polysilicon capacitor structure.

Oxide layer 39 is removed by an etch of buffered hydrofluoric acid at a ratio of 50:1 for 3 minutes, in all but the area under the top capacitor plate, where it acts as dielectric for the polycide-to-polysilicon capacitor. The silicide layer is annealed at a temperature of between about 850° and 1000° C. for between about 30 and 60 minutes, to cause the amorphous refractory metal silicide to change into its crystalline phase.

This results in the FIG. 5 structure. Processing to create the CMOS device is completed as in the first embodiment, in FIGS. 5 to 7. An N-implant is performed in the P-well, spacers formed on the polycide gate and capacitor bottom plate, an N+ implant completes the N-channel device, and a P− implant in the N-well region completes the P-channel transistor. The integrated circuit is completed by forming a passivation layer over the structures described and appropriate electrical connecting structures thereover to electrically connect the gate electrode structures, capacitor and source/drain elements.

Figure 10:
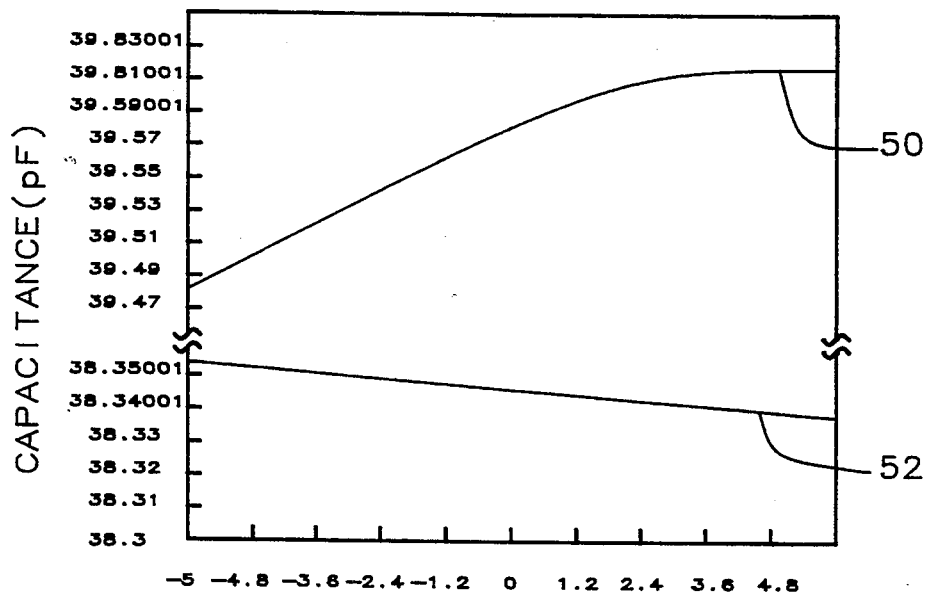
FIG. 10 demonstrates graphically the nature of capacitance over a voltage range, using a prior art process without an ion implant, and the inventive method with an implant.

Some advantages of the invention over the prior art are shown graphically in FIGS. 10 to 13. FIG. 10 demonstrates the non-linear nature of capacitance over a voltage range, for a sample product using the prior art process in which the capacitor bottom plate has no implant, shown as curve 50. The change of the capacitance over a voltage range is known as the voltage coefficient, or Vcc. It is desirable to have as low a Vcc as possible, as well high stability, or linearity. In the FIG. 10 sample, the Vcc for the no implant sample at −5 volts (−5 v) was 203.14 parts per million (ppm) per volt (v). The Vcc at +5 volts (+5 v) was 409.86 ppm/v. Curve 52 demonstrates the highly linear capacitance using the new method of ion implanting the polycide bottom plate, in this sample with an N+ dopant. In this sample, the Vcc (−5 v) was 34.41 ppm/v, much lower than the curve 50 sample. Vcc (+5 v) was 34.94 ppm/v. These two Vcc measurements were almost identical, indicating the high Vcc linearity of the N+ implanted capacitor.

Figure 11:
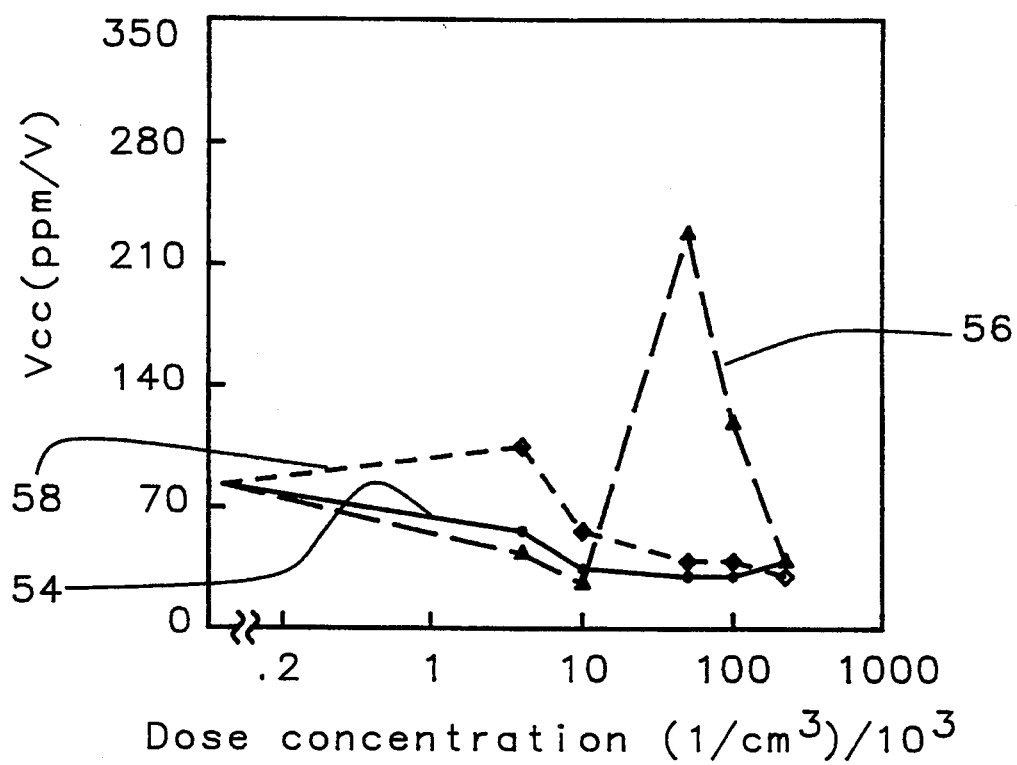
FIGS. 11 demonstrates graphically the voltage coefficient of the capacitor using the new method of ion implanting the polycide bottom plate, with each of three different dopants.

FIG. 11 demonstrates graphically the low and stable voltage coefficient of the capacitor using the new method, for each of three implant dopants, over a range of dosages. Shown are experimentally derived data for Vcc for implants using arsenic 54 (at an implant energy of 80 KeV), boron fluoride 56 (at an implant energy of 60 KeV) and phosphorus 58 (at an implant energy of 70 KeV). Experimental results indicate that a polysilicon-to-polycide capacitor with no implant had a mean Vcc of approximately 300 ppm/V, higher than the Vcc for any of the above implants.

Figure 12:
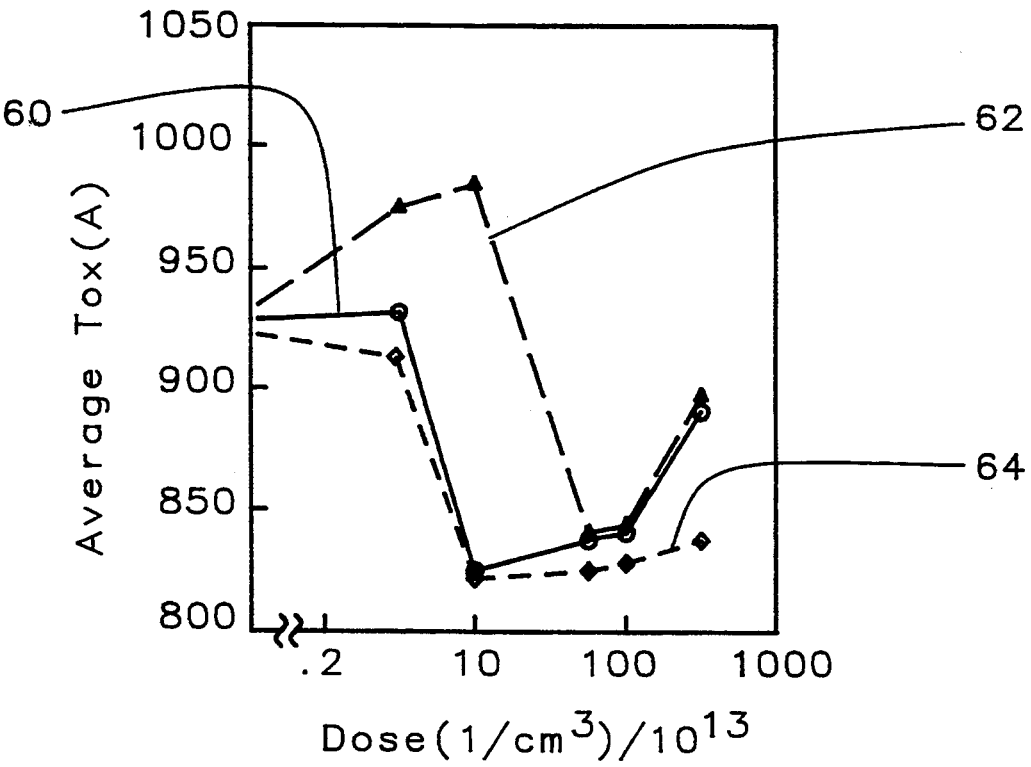
FIG. 12 demonstrates graphically the reduced oxide thickness of the capacitor using the new method, for each of three different dopants.

The invention also results in a thinner oxide for the capacitor. With the heavy ion implant, the presence of implanted ions, such as arsenic (AS), phosphorus (P) or boron fluoride ($BF_2$), prevents oxidation at the interface of the tungsten silicide and oxide dielectric, with a resultant thinner oxide. The capacitance C is defined by the equation $$C = (e_{ox}/T_{ox})A$$

where $e_{ox}$ is the dielectric constant of the oxide, $T_{ox}$ is the oxide thickness, and A is the capacitor area. With the thinner oxide of the invention, the capacitor area can be reduced to provide the same capacitance value. The oxide thicknesses from experiments for implants of arsenic 60, boron fluoride 62 and phosphorus 64, with the same implant energies as in FIG. 11, are indicated in FIG. 12, against a range of dosage concentrations.

Figure 13:
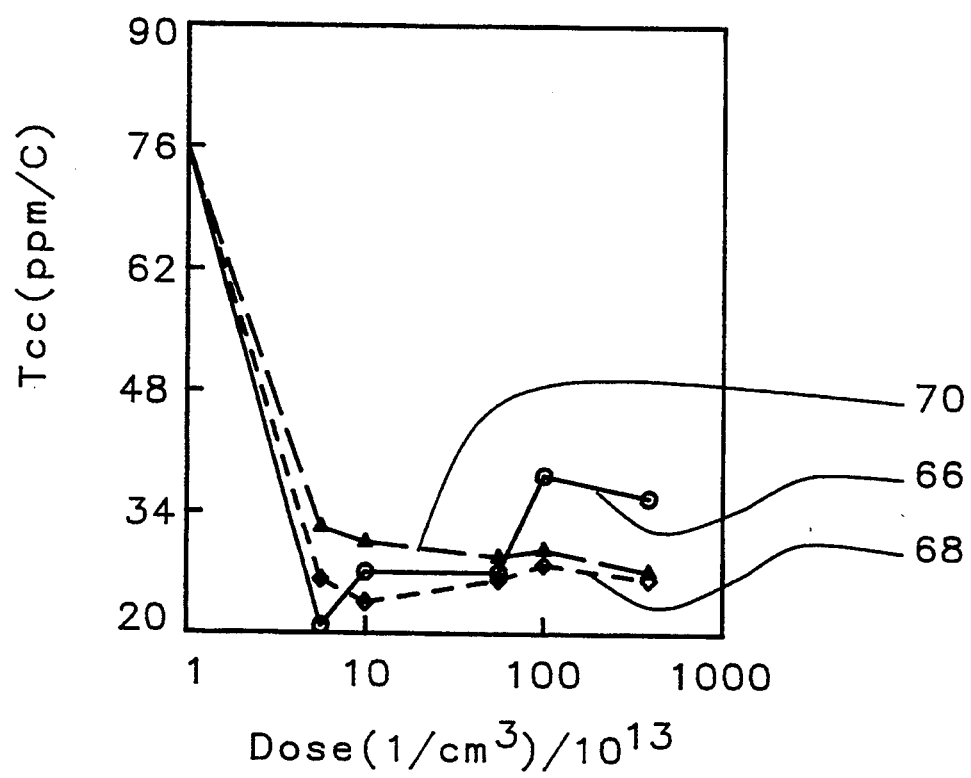
FIG. 13 demonstrates graphically the reduced temperature coefficient of the capacitor using the new method, for each of three different dopants.

FIG. 13 reflects a further advantage of the invention, a lower temperature coefficient, Tcc. The temperature coefficient is the measurement of the change in capacitance vs. a change in temperature. A low Tcc is important for precise capacitor-based CMOS integrated circuits as used for analog applications. Shown in FIG. 13 are Tcc, experimentally derived, for implants of arsenic 66 boron fluoride 68 and phosphorus 70, with the same implant energies as in FIG. 11.

While the invention has been particularly shown and described with reference to the preferred embodiments, it will be understood by those skilled in the art that various changes in form and details may be made without departing from the spirit and scope of the invention. For example, while the detailed examples of the integrated circuit device are CMOS, it is obvious to those skilled in the art that p-channel or n-channel FET devices can also be fabricated in conjunction with a polycide-to-polysilicon capacitor, as part of this invention.

What is claimed is:

1. A method for forming a polycide-to-polysilicon capacitor with a low voltage coefficient and high linearity, in and on a silicon substrate, on an integrated circuit having FET devices which are separated from each other by means of field oxide regions, comprising:

forming a first layer of polysilicon, having a suitable doping concentration, on the surface of said substrate and said field oxide regions;
   forming a layer of silicide over said layer of polysilicon;
   ion implanting in a vertical direction into said layer of silicide to produce said low voltage coefficient and high linearity;
   forming a layer of interpoly oxide over said layer of silicide;
   densifying said layer of interpoly oxide;
   forming a second layer of polysilicon, on the surface of said layer of interpoly oxide;
   doping said second layer of polysilicon;
   patterning said second layer of polysilicon to form the top plate of said capacitor;
   removing said layer of interpoly oxide except in the area under said top plate of said capacitor, where it acts as a capacitor dielectric;
   patterning said layer of silicide and said layer of polysilicon, to form a polycide bottom plate of said capacitor;
   annealing said polycide bottom plate; and
   forming sidewalls on the sides of said polycide bottom plate.

2. The method of claim 1 wherein said ion implanting is with arsenic, in a concentration of between about 1 E 14 and 1 E 16 atoms/cm$^2$ at an energy of between about 60 and 120 KeV.

3. The method of claim 1 wherein said silicide is tungsten silicide.

4. The method of claim I wherein said polycide bottom plate is annealed at a temperature of between about 850° and 1000° C.

5. The method of claim I wherein said ion implanting is with phosphorus, in a concentration of between about 1 E 14 and 1 E 16 atoms/cm$^2$, at an energy of between about 60 and 90 KeV.

6. The method of claim 1 wherein said ion implanting is with boron fluoride, in a concentration of between about 1 E 15 and 5 E 15 atoms/cm$^2$, at an energy of between about 50 and 80 KeV.

7. The method of claim 1 wherein said doping said second layer of polysilicon is by diffusion of $POCl_3$ at a temperature of between about 800° and 920° C.

8. A method for forming an integrated circuit in and on a silicon substrate, with a polycide-to-polysilicon capacitor with low voltage coefficient and high linearity, and with a CMOS device with polycide gate, comprising:

forming field oxide regions, n-well and p-well regions,
   and gate oxide regions in and on said silicon substrate;
   forming a first layer of polysilicon, having a suitable doping concentration, on the surface of said substrate and said field oxide regions;
   forming a layer of silicide over said layer of polysilicon;
   ion implanting in a vertical direction into said layer of silicide to produce said low voltage coefficient and high linearity;
   forming a layer of interpoly oxide over said layer of silicide;
   densifying said layer of interpoly oxide;
   forming a second layer of polysilicon, on the surface of said layer of interpoly oxide;
   doping said second layer of polysilicon;
   patterning said second layer of polysilicon to form the top plate of said capacitor;
   removing said layer of interpoly oxide except in the area under said top plate of said capacitor, where it acts as a capacitor dielectric;
   patterning said layer of silicide and said layer of polysilicon, to form a polycide bottom plate of said capacitor and to form said polycide gate;
   annealing said layer of silicide;

forming source and drain regions of said CMOS device in said substrate in the regions between said polycide gate and said field oxide regions; and forming remaining layers to complete said integrated circuit.

9. The method of claim 8 wherein said ion implanting is with arsenic, in a concentration of between about 1 E 14 and 1 E 16 atoms/cm$^2$ at an energy of between about 60 and 120 KeV.

10. The method of claim 8 wherein said silicide is tungsten silicide.

11. The method of claim 8 wherein said polycide bottom plate is annealed at a temperature of between about 850° and 1000° C.

12. The method of claim 8 wherein said ion implanting is with phosphorus, in a concentration of between about 1 E 14 and 1 E 16 atoms/cm$^2$, at an energy of between about 60 and 90 KeV.

13. The method of claim 8 wherein said ion implanting is with boron fluoride, in a concentration of between about 1 E 15 and 5 E 15 atoms/cm$^2$, at an energy of between about 50 and 80 KeV.

14. The method of claim 8 wherein said doping said second layer of polysilicon is by diffusion of POCl$_3$ at a temperature of between about 800° and 920° C.

15. A method for forming a polycide-to-polysilicon capacitor with a low voltage coefficient and high linearity, in and on a silicon substrate, on an integrated circuit having FET devices which are separated from each other by means of field oxide regions, comprising:

forming a first layer of polysilicon, having a suitable doping concentration, on the surface of said substrate and said field oxide regions;

forming a layer of silicide over said layer of polysilicon;

ion implanting in a vertical direction into said layer of silicide to produce said low voltage coefficient and high linearity;

patterning said layer of silicide and said layer of polysilicon, to form a polycide bottom plate of said capacitor;

forming a layer of interpoly oxide over said layer of silicide and over exposed areas of said substrate and said field oxide regions;

densifying said layer of interpoly oxide;

forming a second layer of polysilicon, on said layer of interpoly oxide;

doping said second layer of polysilicon;

patterning said second layer of polysilicon to form the top plate of said capacitor;

removing said layer of interpoly oxide except in the area under said top plate of said capacitor, where it acts as a capacitor dielectric;

annealing said polycide bottom plate; and forming sidewalls on the sides of said polycide bottom plate.

16. The method of claim 15 wherein said ion implanting is with arsenic, in a concentration of between about 1 E 14 and 1 E 16 atoms/cm$^2$ at an energy of between about 60 and 120 KeV.

17. The method of claim 15 wherein said silicide is tungsten silicide.

18. The method of claim 15 wherein said polycide bottom plate is annealed at a temperature of between about 850° and 1000° C.

19. The method of claim 15 wherein said ion implanting is with phosphorus, in a concentration of between about 1 E 14 and 1 E 16 atoms/cm$^2$, at an energy of between about 60 and 90 KeV.

20. The method of claim 15 wherein said ion implanting is with boron fluoride, in a concentration of between about 1 E 15 and 5 E 15 atoms/cm$^2$, at an energy of between about 50 and 80 KeV.

* * * * *